(12) United States Patent
Klaassen et al.

(10) Patent No.: US 7,872,731 B2
(45) Date of Patent: Jan. 18, 2011

(54) LITHOGRAPHIC APPARATUS AND DEVICE MANUFACTURING METHOD

(75) Inventors: Michel Fransois Hubert Klaassen, Eindhoven (NL); Hendrikus Robertus Marie Van Greevenbroek, Eindhoven (NL); Heine Melle Mulder, Veldhoven (NL); Erik Martijn Greijdanus, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 338 days.

(21) Appl. No.: 11/785,906

(22) Filed: Apr. 20, 2007

(65) Prior Publication Data
US 2008/0259300 A1 Oct. 23, 2008

(51) Int. Cl.
*G03B 27/42* (2006.01)
(52) U.S. Cl. .............. 355/71; 355/53; 355/67; 355/77; 359/497; 359/501
(58) Field of Classification Search .......... 355/53, 355/67, 71, 77; 359/352, 483, 485, 494, 359/496–497, 500–501
See application file for complete search history.

(56) References Cited

U.S. PATENT DOCUMENTS

| 5,363,170 A | * | 11/1994 | Muraki | 355/67 |
| 7,239,446 B2 | * | 7/2007 | Kreuzer | 359/499 |
| 2002/0080338 A1 | * | 6/2002 | Taniguchi | 355/67 |
| 2005/0002111 A1 | * | 1/2005 | Gruner et al. | 359/649 |
| 2005/0206871 A1 | * | 9/2005 | Tsuji | 355/71 |
| 2006/0170901 A1 | | 8/2006 | Tanitsu et al. | |
| 2007/0146676 A1 | * | 6/2007 | Tanitsu et al. | 355/71 |
| 2008/0273185 A1 | * | 11/2008 | Omura et al. | 355/67 |
| 2009/0115989 A1 | * | 5/2009 | Tanaka | 355/71 |

FOREIGN PATENT DOCUMENTS

WO   WO 2005124420 A1 * 12/2005

* cited by examiner

*Primary Examiner*—Hung Henry Nguyen
*Assistant Examiner*—Colin Kreutzer
(74) *Attorney, Agent, or Firm*—Pillsbury Winthrop Shaw Pittman LLP

(57) ABSTRACT

A lithographic apparatus includes a polarization changing element including at least two wedge-shaped optically active members configured to rotate the polarization direction of at least a portion of the radiation beam with a predetermined angle with respect to the first direction and an optical propagation length adaptor associated with the wedge-shaped optically active members to adjust the predetermined angle.

21 Claims, 8 Drawing Sheets

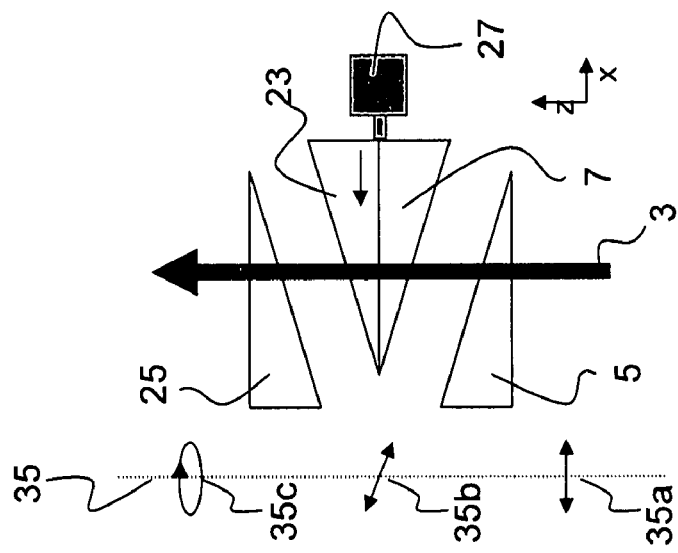
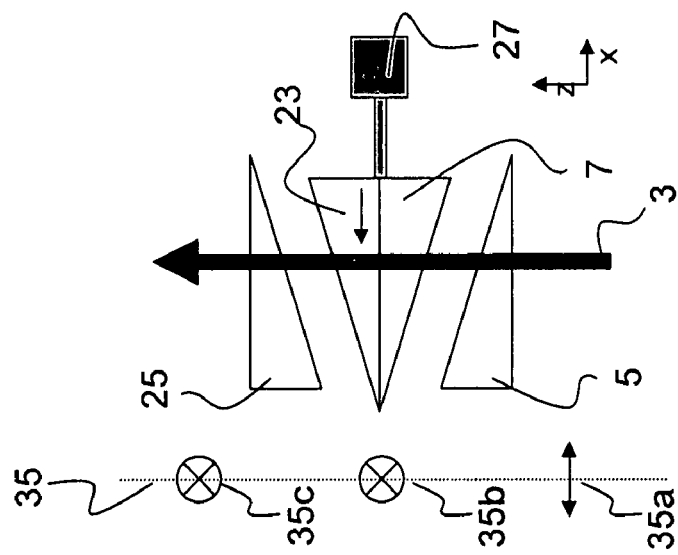
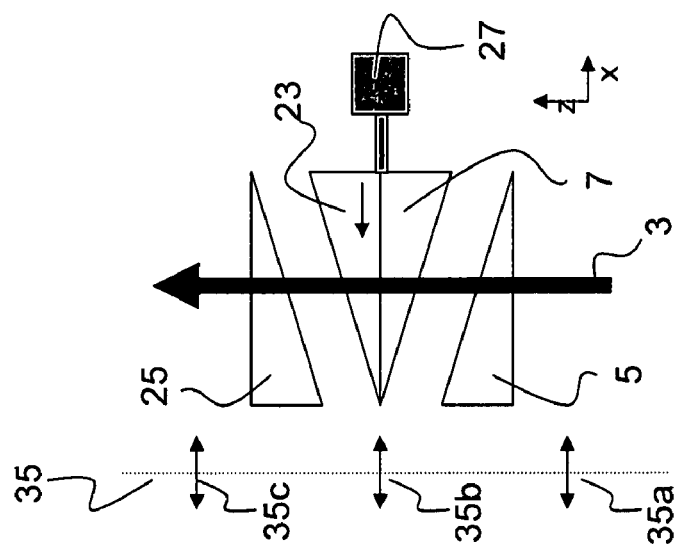

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The demand for ever-smaller features with smaller pitches to be imaged with lithographic apparatus such as steppers and scanners has resulted in the use of projection systems with increasing numerical aperture (NA). The angle of rays of radiation within the projection apparatus with respect to the optical axis increases with increasing NA and decreasing feature pitch. The vector nature of radiation becomes important for imaging these features because only identically polarized components of electromagnetic waves interfere. Therefore, it is not the wavefront quality alone that determines the image contrast; also the polarization of the radiation beam has a considerable influence on image contrast.

Conventionally, a radiation source used for a lithographic apparatus outputs a linearly polarized radiation beam. In conventional lithographic apparatus, polarization changing elements have been implemented to change the polarization state of either an entire cross-section or segments of the cross-sections of the radiation beam. Such polarization state changing optical components may use optical retarders, for example quarter lambda or half lambda plates.

US 2006/0170901 A1 describes a lithographic apparatus in which a polarization direction of segments of the radiation beam are adjusted using a polarization-modulating element. The polarization-modulating element contains segments of optical active material of different thickness for inducing a fixed adjustment of the polarization direction for each individual segment of the radiation beam.

SUMMARY

It is desirable to provide a lithographic apparatus with a polarization changing element which offers a continuously variable adjustment of the polarization direction of the radiation beam.

According to an embodiment of the invention, there is provided a lithographic apparatus including an illumination system configured to condition a radiation beam with a polarization in a first direction which propagates along an optical axis; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a polarization changing element including at least two wedge-shaped optically active members configured to rotate the polarization direction of at least a portion of the radiation beam with a predetermined angle with respect to the first direction and an optical propagation length adaptor associated with the wedge-shaped optically active members to adjust the predetermined angle.

In an embodiment, the optical propagation length adaptor is configured to move at least one of the wedge-shaped optically active members.

In a further embodiment, the optical propagation length adaptor is configured to move the wedge-shaped optically active member in a direction substantially transverse to the optical axis.

In a further embodiment, an exit surface of the first wedge-shaped optically active member is in optical contact with an entry surface of the second wedge-shaped optically active member.

In a further embodiment, the optical propagation length adaptor further includes a plane parallel plate configured to correct for a beam displacement.

In a further embodiment, the optical propagation length adaptor further includes a first wedge-shaped non-optically active member and a second wedge-shaped non-optically active member, wherein at least one of the first wedge-shaped non-optically active member and second wedge-shaped non-optically active member is configured to move in conjunction with the translatable wedge-shaped optically active member.

In a further embodiment, the optical propagation length adaptor is configured to move the wedge-shaped optically active member and the wedge-shaped non-optically active member in a direction substantially transverse to the optical axis.

In a further embodiment, the optical propagation length adaptor is configured to move the wedge-shaped optically active member in a first direction substantially parallel to the optical axis and to move the wedge-shaped non-optically active member in a second direction, wherein the second direction is opposite to the first direction.

In a further embodiment, at least one of the first wedge-shaped non-optically active member and second wedge-shaped non-optically active member includes a retarder material.

In a further embodiment, at least two wedge-shaped optically active members and first and second wedge-shaped non-optically active members include a pie-shaped cross-section in a plane transverse to the optical axis.

In a further embodiment, an angle of the pie-shaped cross-section enclosed by the sides of the pie-shaped cross-section transecting the optical axis includes an angle of about 45 degrees.

In a further embodiment, the polarization changing element is located at or near a pupil plane of the illumination system.

In a further embodiment, the wedge-shaped optically active members include crystalline quartz.

According to a further embodiment of the invention, there is provided a device manufacturing method including generating a radiation beam with a polarization in a first direction; rotating the polarization direction of at least a portion of the radiation beam with a predetermined angle with respect to the first direction using at least two wedge-shaped optically active members; imparting the radiation beam with a pattern in its cross-section to form a patterned radiation beam; projecting the patterned radiation beam onto a target portion of a substrate using a projection system; and controlling the predetermined angle by changing an optical propagation length of the radiation beam through the at least two wedge-shaped optically active members.

In a further embodiment, the device manufacturing method further includes correcting a transverse displacement of the radiation beam using a first wedge-shaped non-optically active member and a second wedge-shaped non-optically active member.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 8a schematically depicts a first setting of a polarization changing element including an optical retarder configured to change a linearly polarized radiation beam into an unpolarized radiation beam in accordance with an embodiment of the invention;

FIG. 8b schematically depicts a second setting of a polarization changing element including an optical retarder configured to change a linearly polarized radiation beam into an unpolarized radiation beam in accordance with an embodiment of the invention;

FIG. 8c schematically depict a third setting of a polarization changing element including an optical retarder configured to change a linearly polarized radiation beam into an unpolarized radiation beam in accordance with an embodiment of the invention;

DETAILED DESCRIPTION

Figure 1:
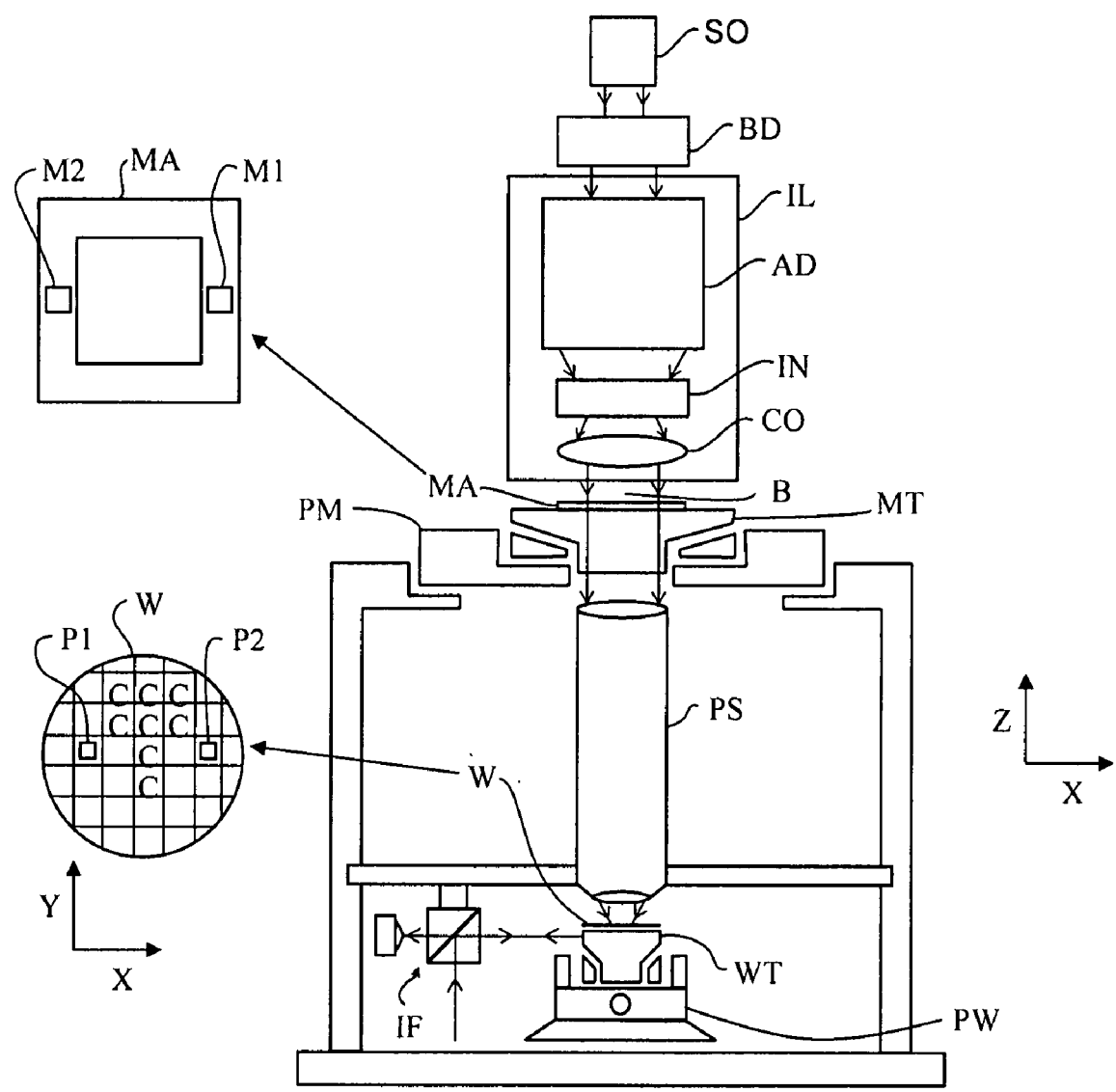
FIG. 1 schematically depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or deep UV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure or pattern support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
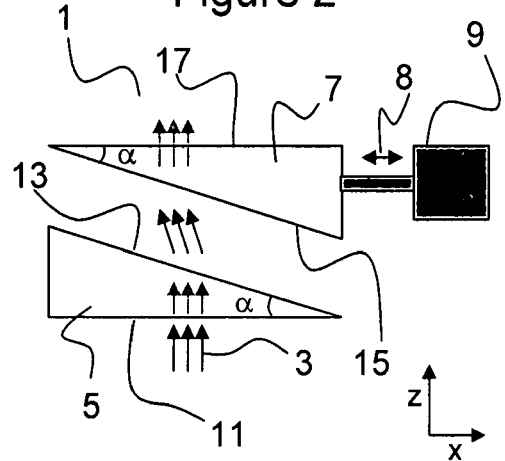
FIG. 2 schematically depicts a polarization changing element according to an embodiment of the invention.

FIG. 2 depicts a polarization changing element 1 according to an embodiment of the invention. The polarization changing element 1 includes a first wedge-shaped optically active member 5 and a second wedge-shaped optically active member 7. Both optically active members are made of, for example, crystalline quartz ($SiO_2$). Furthermore, the polarization changing element 1 includes an optical propagation length adaptor 9 associated with the wedge-shaped optically active members 5 and 7. In use, the first wedge-shaped optically active member 5 receives a radiation beam 3 having a linear polarization in a first direction, for example x, and a propagation direction parallel to the z-axis via an entry surface 11. The first wedge-shaped optically active member 5 transmits the radiation beam 3 via an exit surface 13 towards an entry surface 15 of the second wedge-shaped optically active member 7. The radiation beam 3 exits the second wedge-shaped optically active member 7 at an exit surface 17. The radiation beam may be incident on the entry surface 11 at an angle different from the normal.

An angle $\alpha$ is defined by the enclosed angle between the entry surface and exit surface of the first wedge-shaped optically active member 5. Consequently, the radiation beam 3 exits the first wedge-shaped optically active member 5 at an angle $\beta = \sin^{-1}(n_1 \sin \alpha / n_0)$ with respect to the exit surface 13, wherein $n_1$ is a refractive index of the first wedge-shaped optically active member and $n_0$ is refractive index of the surrounding medium. The orientation of the first wedge-shaped optically active member 5 with respect to the second wedge-shaped optically active member 7 is such that the radiation beam 3 is incident on the entry surface 15 of the second wedge-shaped optically active member 7 at the same angle $\beta$. The second wedge-shaped optically active member has a refractive index $n_1$ equal to that of the first wedge-shaped optically active member, therefore the radiation beam is diffracted such that it traverses the second wedge-shaped optically active member 7 in a direction that is again parallel to the z-axis.

As the radiation beam 3 traverses the first and second wedge-shaped optically active members 5 and 7, the polarization direction of the linearly polarized radiation beam 3 is adjusted due to the optical activity of the material of the first and second wedge-shaped optically active members. Optical activity or optical rotation is a type of birefringence. Optical activity of a material is described as a rotation in a plane transverse to the propagation direction of linearly polarized radiation as it travels through the material. Such material may be crystalline quartz ($SiO_2$). Any linear polarization of light can be written as an equal combination of dextrorotatory and levorotatory polarized light. In an optically active material, the two circular polarizations experience different refractive indices. The difference in the indices quantifies the strength of the optical activity and is an intrinsic characteristic of the material. Since the enclosed angle $\alpha$ between the entry and exit surface of the first and second wedge-shaped optically active members 5, 7 is equal, a total propagation length of each segment in the cross-section of the radiation beam through optically active material is equal. This results in an equal rotation of polarization direction at each segment in the cross-section of the radiation beam after completely traversing the polarization changing element.

Figure 3:
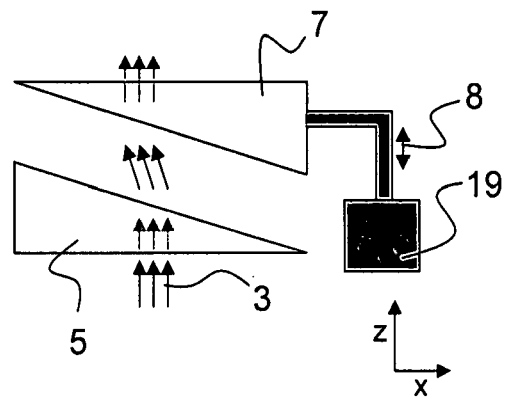
FIG. 3 schematically depicts a polarization changing element including an optical propagation length adaptor configured to move the second wedge-shaped optically active member in a direction substantially parallel to the propagation direction of the radiation beam in accordance with an embodiment of the invention.

In the embodiment of FIG. 2, the optical propagation length adaptor 9 is arranged to move the second wedge-shaped optically active member 7 with respect to the first wedge-shaped optically active member 5. The movement of the second wedge-shaped optically active member 7 may be substantially perpendicular to the propagation direction of the radiation beam 3, as indicated by an arrow 8. FIG. 3 depicts a further embodiment of the invention, showing a polarization changing element including a first wedge-shaped optically active member 5, a second wedge-shaped optically active member 7 and an optical propagation length adaptor 19, wherein the optical propagation length adaptor 19 is configured to move the second wedge-shaped optically active member 7 in a second translation direction substantially parallel to the propagation direction of the radiation beam 3. Alternatively, an optical propagation length adaptor may be configured to move the second wedge-shaped optically active member in any rectilinear or non-rectilinear translation direction with respect to the propagation direction of the radiation beam.

Figure 4:
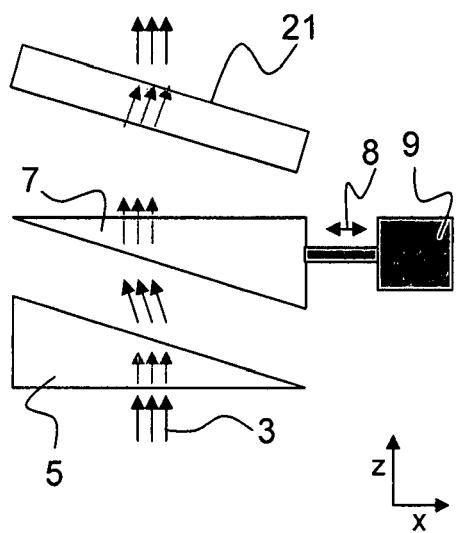
FIG. 4 schematically depicts a polarization changing element further including a plane-parallel plate in accordance with an embodiment of the invention.
Figure 5:
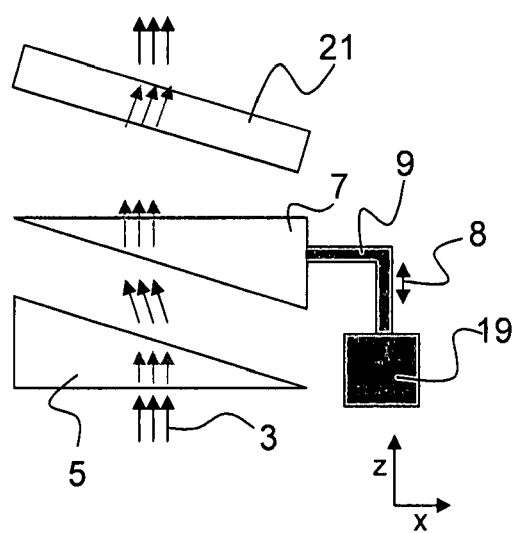
FIG. 5 schematically depicts a polarization changing element including a plane-parallel plate, wherein the optical propagation length adaptor is arranged to move the second wedge-shaped optically active member in a direction substantially parallel to the propagation direction of the radiation beam in accordance with an embodiment of the invention.

FIG. 4 schematically depicts an embodiment of the polarization changing element including a first wedge-shaped optically active member 5, a second wedge-shaped optically active member 7, an optical propagation length adaptor 9 and further including a plane-parallel plate 21. In use, after propagating through the two wedge-shaped optically active members 5 and 7, the radiation beam 3 is displaced in a direction transverse to the propagation direction of the radiation beam. This displacement is caused by the refraction of the radiation beam at the exit surface of the first wedge-shaped optically active member and the entry surface of the second wedge-shaped optically active member. The beam displacement is corrected using a plane parallel plate 21. In this embodiment, the optical propagation length adaptor 9 is arranged to move the second wedge-shaped optically active member 7 in a direction substantially perpendicular to the propagation direction of the radiation beam, as indicated by arrow 8. FIG. 5 depicts a further embodiment of the polarization changing element including a plane-parallel plate, wherein the optical propagation length adaptor 19 is arranged to move the second wedge-shaped optically active member 7 in a second translation direction substantially parallel to the propagation direction of the radiation beam.

Figure 6:
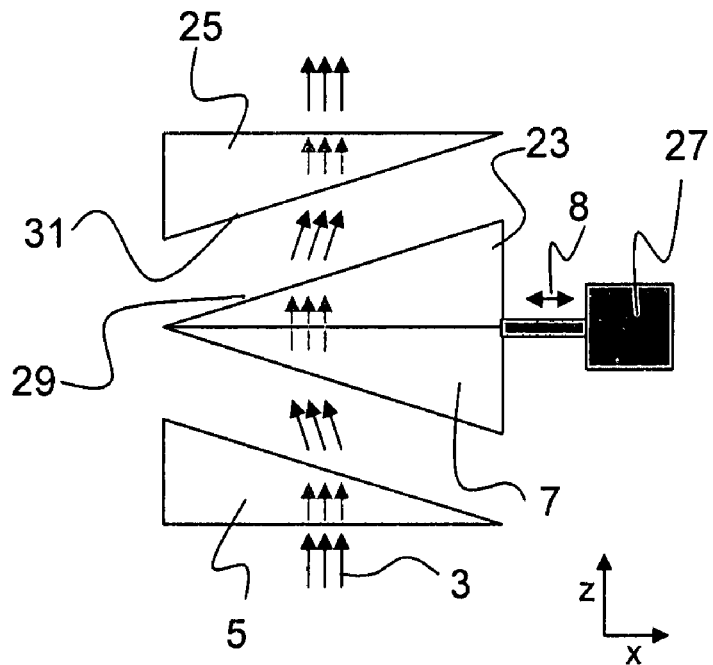
FIG. 6 schematically depicts a polarization changing element further including two wedge-shaped non-optically active members for correcting a beam displacement in accordance with an embodiment of the invention.

FIG. 6 schematically depicts a further embodiment of the polarization changing element further including two wedge-shaped non-optically active members 23, 25 configured to correct a beam displacement. Both non-optically active members are made of, for example, fused silica ($SiO_2$), $CaF_2$ or $MgF_2$. Similarly to the embodiment of FIG. 2, this embodiment includes a first and second wedge-shaped optically active member 5 and 7 configured to adjust a polarization direction of the radiation beam 3. The first wedge-shaped non-optically active member 23 is arranged which is in optical contact with the second wedge-shaped optically active member 7. The second wedge-shaped non-optically active member 25 is arranged with respect to the propagation direction of the radiation beam 3 after the first wedge-shaped non-optically active member 25. The entry surface of the second wedge-shaped non-optically active member 31 is substantially parallel to the exit surface 29 of first wedge-shaped non-optically active member 23. The two wedge-shaped non-optically active members 23, 25 include a material having a refractive index $n_1$ that is identical to the refractive index $n_1$ of the two wedge-shaped optically active members 5, 7. Furthermore, angle α enclosed between the entry surface and exit surface for all four wedge-shaped optical members 5, 7, 23, 25 is identical. In use, a radiation beam 3 having a linear polarization in a first direction propagates in a direction substantially parallel to the z-axis and traverses the first and second wedge-shaped optically active members 5 and 7, similarly to the embodiments describes previously. Since the second wedge-shaped optically active member 7 and the first wedge-shaped non-optically active member 23 are in optical contact and have the same refractive index $n_1$, the radiation beam 3 is not refracted at a contact plane between the second wedge-shaped optically active member 7 and the first wedge-shaped non-optically active member 23. The radiation beam 3 exits the first wedge-shaped non-optically active member 23 at an exit surface 29. Subsequently, the radiation beam 3 is incident on an entry surface of the second wedge-shaped non-optically active member 25. An optical propagation length adaptor 27 is arranged to move the second wedge-shaped optically active member 7 in conjunction with the first wedge-shaped non-optically active member 23 with respect to the first wedge-shaped optically active member 5 and the second wedge-shaped non-optically active member 25 in a first translation direction substantially perpendicular to the propagation direction of the radiation beam 3, as indicated by arrow 8.

Figure 7:
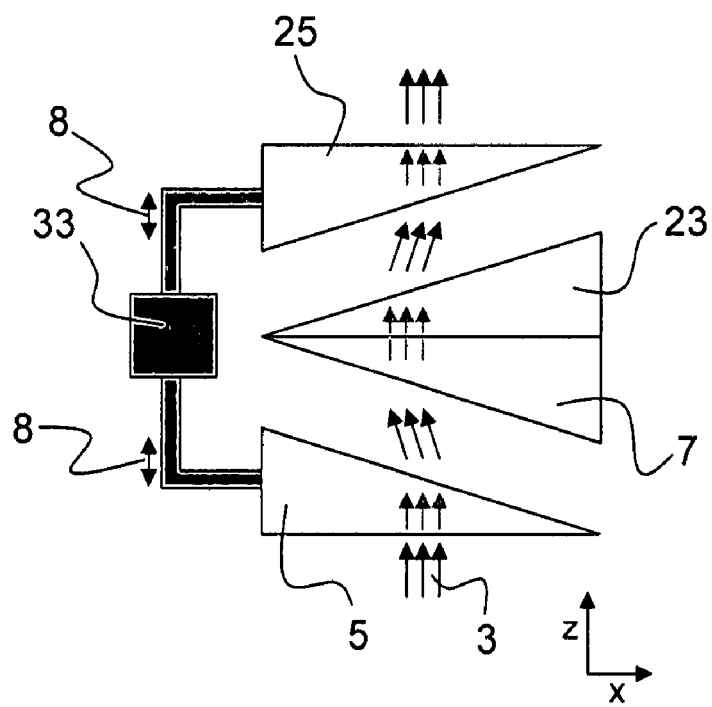
FIG. 7 schematically depicts an optical propagation length adaptor configured to move the first wedge-shaped optically active member and the second wedge-shaped non-optically active member in an opposite direction with respect to each other and substantially parallel to the propagation direction of the radiation beam in accordance with an embodiment of the invention.

FIG. 7 depicts a further embodiment wherein an optical propagation length adaptor 33 is configured to move the first wedge-shaped optically active member 5 and the second wedge-shaped non-optically active member 25 in an opposite direction with respect to each other and substantially parallel to the propagation direction of the radiation beam 3. Alternatively, an optical propagation length adaptor may be configured to move the first wedge-shaped optically active member 5 and the second wedge-shaped non-optically active member 25 in any rectilinear or non-rectilinear direction with respect to the propagation direction of the radiation beam 3. In an alternative embodiment, the second wedge-shaped optically active member 7 and the first wedge-shaped non-optically active member 23 may be separated from each other. In this embodiment, an optical propagation length adaptor may be configured to move the second wedge-shaped optically active member 7 and the first wedge-shaped non-optically active member 23 in an opposite direction with respect to each other and substantially parallel to the propagation direction of the radiation beam 3 or in any rectilinear or non-rectilinear direction with respect to the propagation direction of the radiation beam 3. In an alternative embodiment, the wedge-shaped non-optically active members include a refractive index $n_2$ and an angle $\chi$ enclosed between the entry and exit surface that are different from the refractive index $n_1$ and the angle α enclosed between the entry and exit surface of the wedge-shaped optically active members. The person skilled in the art understands that various combinations of refractive index $n_2$ and angle $\chi$ of the wedge-shaped non-optically active members will result in a correction of a beam displacement that is similar to the correction of the beam displacement using wedge-shaped non-optically active members with refractive index $n_1$ and angle α enclosed between the entry and exit surface.

FIGS. 8a, 8b and 8c schematically depict a further embodiment of a polarization changing element including an optical retarder for changing a linearly polarized radiation beam into an unpolarized radiation beam. This embodiment is similar to the configuration according to FIG. 6, wherein the first wedge-shaped non-optically active member 23 includes an optical retarder material having a fast axis in a direction transverse to the propagation direction of the radiation beam. The optical retarder material may be a linear birefringent material. With reference to FIGS. 8a, 8b and 8c, this first wedge-shaped non-optically active member 23 including an optical retarder material having a fast axis in a direction transverse to the propagation direction of the radiation beam is further referred to as optical retarder 23. Functioning of the embodiment of the polarization changing element will now be described by referring to FIGS. 8a, 8b and 8c. FIGS. 8a, 8b and 8c schematically depict three different settings of a further embodiment of the polarization changing element, wherein an arrow in the wedge-shaped optical retarder 23 indicates the direction of the fast axis of the retarder material. A diagram 35 on the left side of the polarization changing element indicates a polarization direction of the radiation beam 3 propagating in a direction substantially parallel to the z-axis. The polarization direction is shown at three stages. A first stage 35a indicates the initial polarization direction of the linearly polarized radiation beam 3 before it is incident on the polarization changing element. The polarization direction of the radiation beam at this stage is substantially parallel to the x-axis, also referred to as X-polarized, for all settings of the polarization changing element. A second stage 35b indicates the polarization direction of the radiation beam 3 after traversing the first and second wedge-shaped optically active members 5 and 7. A third stage 35c indicates the polarization direction of the radiation beam 3 after traversing the optical retarder 23 and the second wedge-shaped non-optically active member 25.

In the first setting of the polarization changing element, the total thickness of the optical active material of the two wedge-shaped optically active members 5 and 7 that is traversed by the radiation beam is such that along the optical path the polarization direction of the radiation beam is rotated around the z-axis over a multiple of 180° as shown in FIG. 8a. Since the polarization direction of the radiation beam 3 in the optical retarder 23 is substantially parallel to the fast axis of the retarder material, the radiation beam 3 is not retarded at any position in its cross-section. After traversing the second wedge-shaped non-optically-active member 25 and thus having traversed the polarization changing element, the radiation beam remains linearly polarized in a polarization direction that is equal to the initial polarization direction of the radiation beam 3 before traversing the polarization changing element.

In the second setting of the polarization changing element, the total thickness of the optical active material of the two wedge-shaped optically active members that is traversed by the radiation beam is such that along the optical path the polarization direction of the radiation beam is rotated around the z-axis over a multiple of 90°, as shown in FIG. 8b. Since the polarization direction of the radiation beam in the optical retarder is substantially perpendicular to the fast axis of the retarder material, the radiation beam is not retarded at any position in its cross-section. After traversing the second wedge-shaped non-optically-active member and thus having traversed the polarization changing element, the radiation beam is linearly polarized in a polarization direction that rotated around the z-axis over 90° with respect to the initial polarization direction of the radiation beam before traversing the polarization changing element. This type of polarization of the radiation beam is also referred to as Y-polarized.

In the third setting of the polarization changing element, the total thickness of the optical active material of the two wedge-shaped optically active members that is traversed by the radiation beam is such that along the optical path the polarization direction of the radiation beam is rotated around the z-axis over about 45°, as shown in FIG. 8c. Since in the optical retarder the polarization direction of the radiation beam is rotated over an angle of about 45° with respect to the fast axis of the retarder material, the radiation beam is retarded by the wedge-shaped optical retarder. Due to the wedge shape of the optical retarder, the retardance of the radiation beam varies across the cross-section of the radiation beam. The varying retardance of the radiation beam across its cross-section causes the radiation beam to become randomly polarized after traversing the second wedge-shaped non-optically-active member and thus having traversed the polarization changing element, the radiation beam is randomly polarized.

In lithography, exposing the substrate with randomly polarized light has the same lithographic effect as exposing with unpolarized radiation. In the embodiment according to FIGS. 8a, 8b and 8c, the first wedge-shaped non-optically active member 23 includes a retarder material. Alternatively, the retarder material may be included in the wedge-shaped non-optically active member 25. A benefit of the embodiment of FIGS. 8a, 8b and 8c is that fast switching is possible between three of the most often used polarization states of the radiation beam with just one polarization changing element. Furthermore, by rotating the polarization direction of the radiation beam over an angle of approximately but not equal to about 45° with respect to the fast axis of the retarder material, for example 47°, the radiation beam may be effectively unpolarized with a polarized residual. The residual may be adjusted to compensate for polarization selectivity of the illumination system or projection system.

Figure 9:
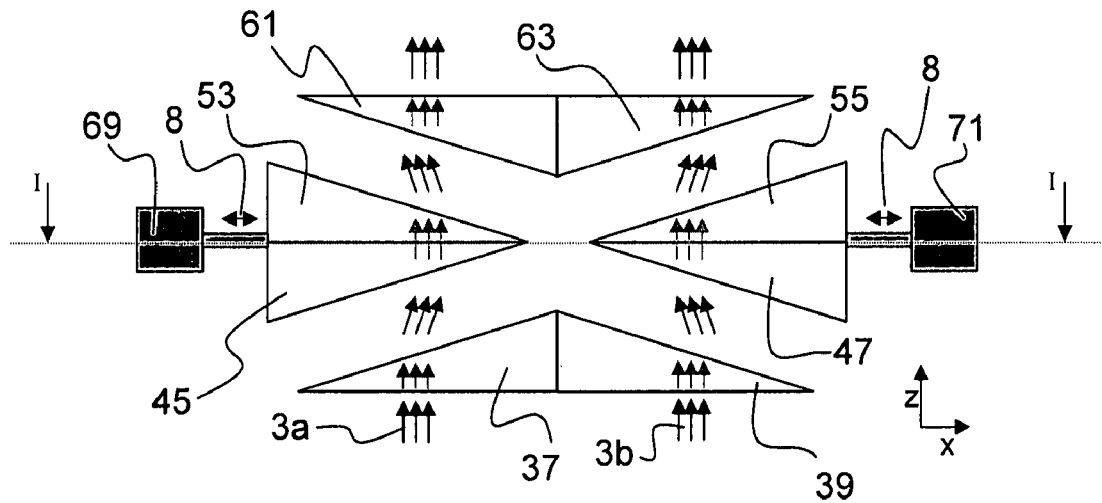
FIG. 9 schematically depicts a polarization changing element configured to adjust a polarization direction of at least one of four segments of the radiation beam in accordance with an embodiment of the invention.
Figure 10:
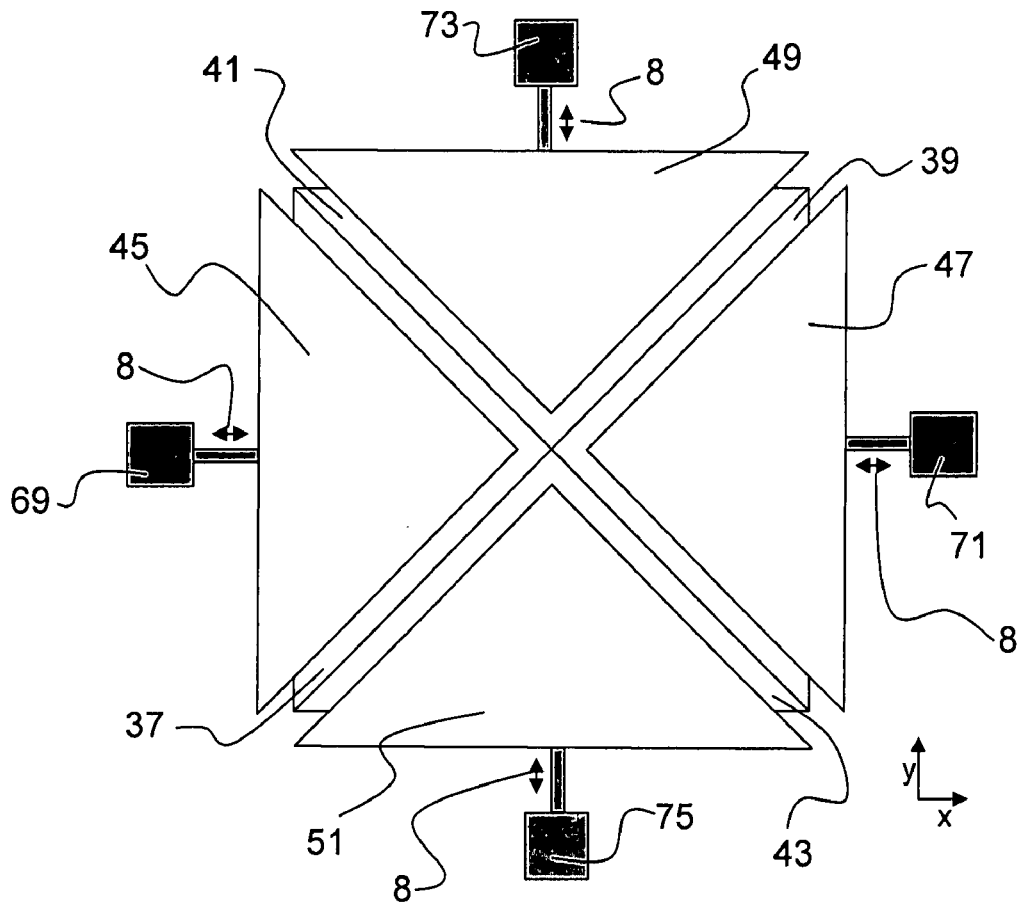
FIG. 10 schematically depicts a cross-sectional view of the embodiment of FIG. 9 along line I-I.

FIG. 9 schematically depicts an embodiment of a polarization changing element configured to adjust a polarization direction of at least one of four segments of the radiation beam. FIG. 9 shows a cross sectional view of the polarization changing element in a plane spanned by the z-axis and x-axis. FIG. 10 schematically depicts a cross-sectional view in plane y-x of the embodiment of FIG. 9 along line I-I. For convenience, only a first and second segment 3a, 3b of the radiation beam are shown in FIG. 9. Referring to both FIGS. 9 and 10, along the propagation direction of the radiation beam 3a, 3b, the polarization changing element includes four wedge-shaped optically active members 37, 39, 41, 43, four further wedge-shaped optically active members 45, 47, 49, 51, four wedge-shaped non-optically active members 53, 55, 57 (not shown), 59 (not shown) and four further wedge-shaped non-optically active members 61, 63, 65 (not shown), 67 (not shown). Furthermore, the polarization changing element includes four optical propagation length adaptors 69, 71, 73, 75. The four wedge-shaped optically active members 37, 39, 41, 43 are arranged to form a pyramid-shaped optically active member. Alternatively, the four wedge-shaped optically active members may be integrated in one optically active element. The four further wedge-shaped optically active members 45, 47, 49, 51 each are in optical contact with one of the four wedge-shaped non-optically active members 53, 55, 57 (not shown), 59 (not shown). For each pair of further wedge-shaped optically active member and wedge-shaped non-optically active member an optical propagation length adaptor 69, 71, 73, 75 is configured to translate both members in a direction transverse to the propagation direction of the radiation beam 3a, 3b. The four further wedge-shaped non-optically active members 61, 63, 65 (not shown), 67 (not shown) are arranged to form a pyramid-shaped optical member. Alternatively, the four further wedge-shaped non-optically active members may be included in one optical element. In an alternative embodiment, the optical members may include a shape equivalent to a quarter of a cone shape. In contrast with the square shaped cross-sectional view of the polarization changing element shown in FIG. 10, in this embodiment, the cross-sectional view along the z-axis shows a circularly shaped polarization changing element. The embodiment of FIGS. 9 and 10 uses a principle similar to the embodiment of FIG. 6. In use, a radiation beam 3a, 3b is incident on an entry surface of the polarization changing element. A polarization direction of a segment of the radiation beam 3a or 3b may be adjusted by movement of respectively the wedge-shaped optically active members 45 or 47. The optical propagation length adaptors may be actuated individually to individually adjust the polarization direction of the respective segments of the radiation beam. The optical propagation length adaptors 69, 71 move the wedge-shaped optically active members 45, 47 in conjunction with respectively the wedge-shaped non-optically active members 53, 55. After traversing the translatable wedge-shaped optically active members 45, 47 and wedge-shaped non-optically active members 53, 55, the radiation beam segments 3a, 3b traverse through wedge-shaped non-optically active members 61, 63. After traversing the polarization changing element, the polarization direction of the radiation beam segments are individually adjusted without introducing a beam displacement.

Figure 11:
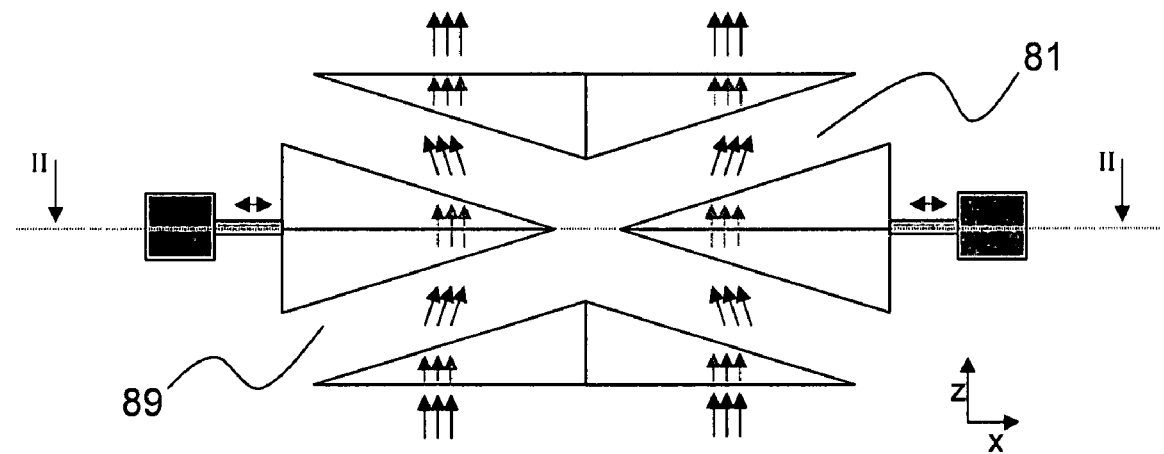
FIG. 11 schematically depicts a polarization changing element configured to individually change a polarization direction of at least one of eight segments of the radiation beam in accordance with an embodiment of the invention.
Figure 12:
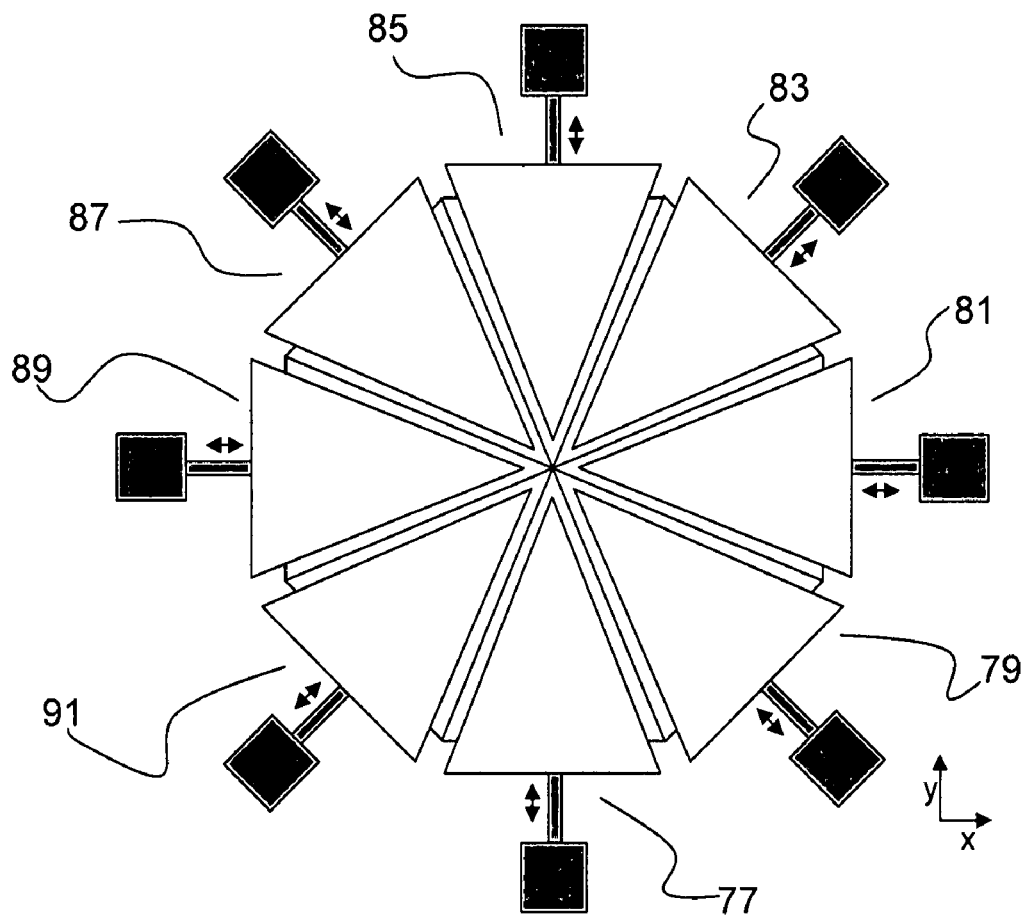
FIG. 12 schematically depicts a cross-sectional view of the embodiment of FIG. 11 along line II-II.

FIG. 11 schematically depicts a further embodiment of a polarization changing element configured to individually change a polarization direction of at least one of eight segments of the radiation beam. FIG. 12 schematically depicts a cross-sectional view in plane y-x of the embodiment of FIG. 11 along line II-II. The person skilled in the art will appreciate that the embodiment of FIGS. 11 and 12 may be operated in a similar way as the embodiment of FIGS. 9 and 10, except for that in this embodiment the radiation beam is divided into eight segments 77, 79, 81, 83, 85, 87, 89, 91 for which individually the polarization direction may be adjusted by individually actuating the respectively associated optical propagation length adaptors. A benefit of the embodiment according to FIGS. 11 and 12 is that in this embodiment, the polarization of each individual pole of often used illumination modes, e.g. quadrupole and dipole, may be separately adjusted by actuating one optical propagation length adaptor. The embodiments of FIGS. 9 and 10 and FIGS. 11 and 12 have been described as examples only, other embodiments may include separating the radiation beam in any amount of segments. In all of these embodiments, the wedge-shaped optically active members and the wedge-shaped non-optically active members include a pie-shaped cross-section in a plane transverse to the optical axis. In the embodiment of FIGS. 11 and 12, the angle of the pie-shaped cross-section enclosed by the sides of the pie-shaped cross-section transecting the optical axis includes an angle of about 45 degrees.

Figure 13:
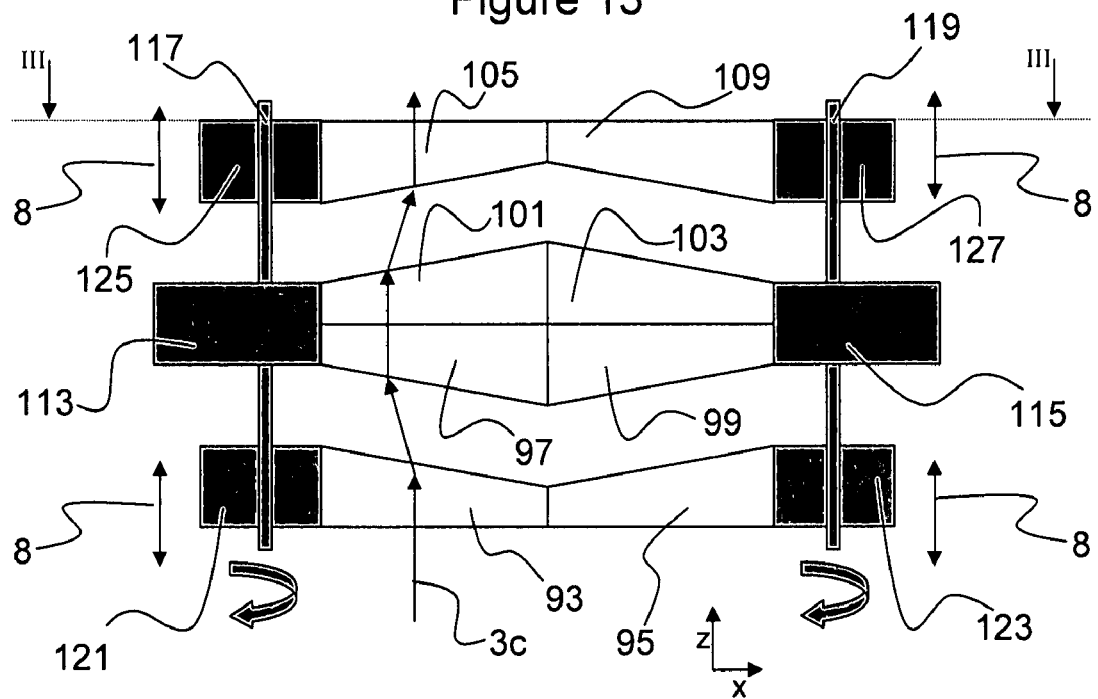
FIG. 13 schematically depicts a polarization changing element configured to adjust a polarization direction of at least one of eight segments of the radiation beam in accordance with an embodiment of the invention.
Figure 14:
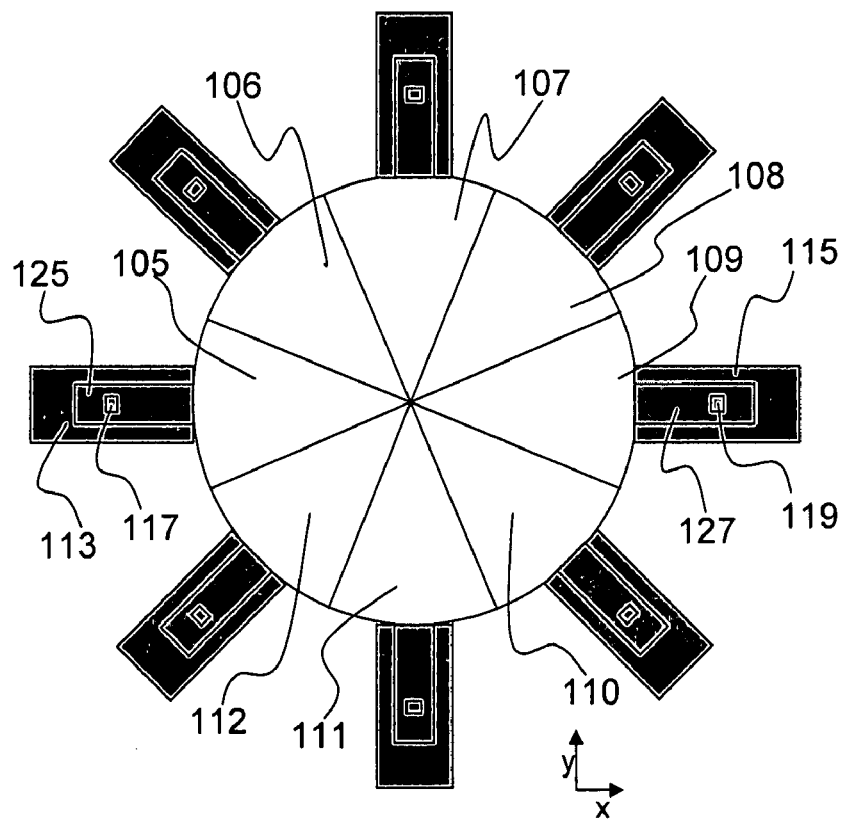
FIG. 14 schematically depicts a top view of the embodiment of FIG. 13 along line III-III.
Figure 15:
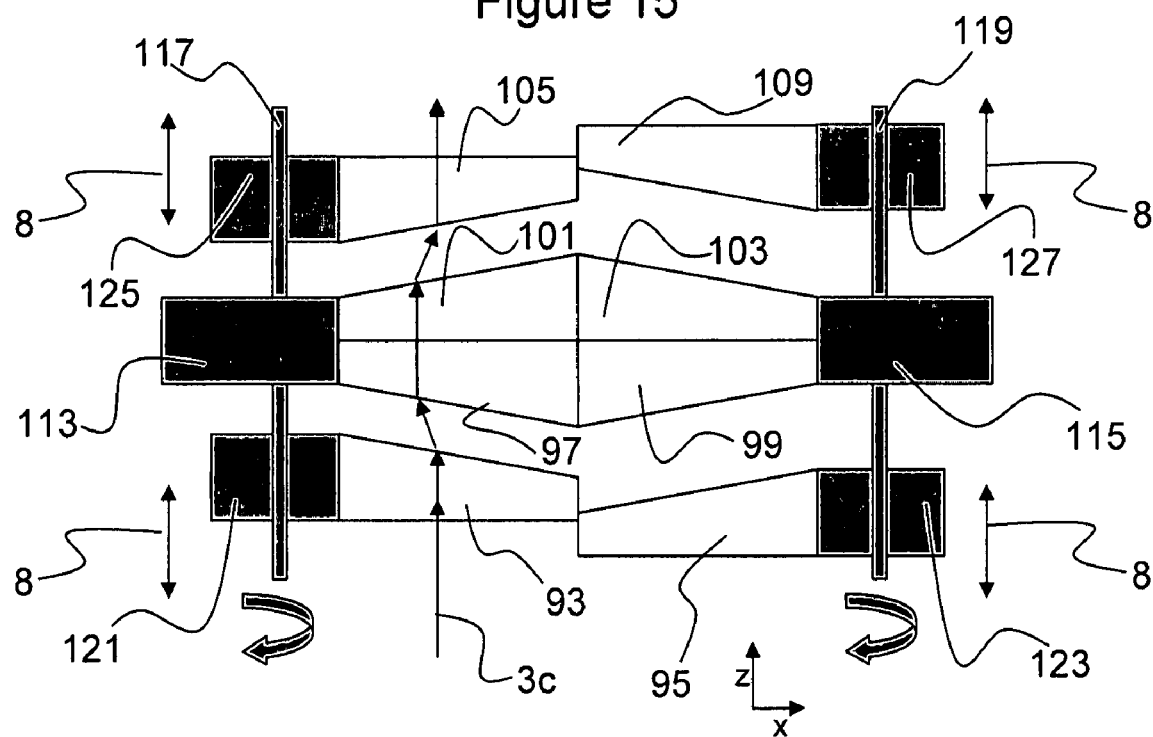
FIG. 15 schematically depicts the embodiments of FIGS. 13 and 14 wherein the polarization direction of one segment of the radiation beam is adjusted.

FIG. 13 schematically depicts a further embodiment of a polarization changing element configured to adjust a polarization direction of at least one of eight segments of the radiation beam. FIG. 14 schematically depicts a top view of the embodiment of FIG. 13 along line III-III. Referring to both FIGS. 13 and 14, along the propagation direction of the radiation beam segment 3c, the polarization changing element includes eight wedge-shaped optically active members 93, 95, eight further wedge-shaped optically active members 97, 99 are shown, eight wedge-shaped non-optically active members 101, 103 and eight further wedge-shaped non-optically active members 105-112. Furthermore, the polarization changing element includes eight optical propagation length adaptors 113, 115, wherein each propagation length adaptor 113, 115 is connected to one wedge-shaped optically active member 97, 99 and one wedge-shaped non-optically active members 101, 103 adjacent to and in optical contact with the wedge-shaped optically active members 97, 99. By means of a thread 117, 119 each optical propagation length adaptor 113, 115 is connected to a support structure 121, 123 configured to support one of the wedge-shaped optically active members 93, 95. Also, by means of the thread 117, 119 each optical propagation length adaptor 113, 115 is connected to a support structure 125, 127 configured to support one of the further wedge-shaped non-optically active members 105, 109. In use, each pair of wedge-shaped optically active members 93, 95 and further wedge-shaped non-optically active members 105-112 associated with the same optical propagation length adaptor 113, 115 are configured to move in opposite directions by rotating thread 117, 119 using the optical propagation length adaptor. In the embodiment of FIGS. 13 and 14, wherein all wedge-shaped members include identical wedge shapes and identical refractive indices, each pair of wedge-shaped optically active members 93, 95 and further wedge-shaped non-optically active members 105, 109 may be configured to move over an equal amount of distance along thread 117, 119. Alternatively, threads 117, 119 may be configured to have a first pitch to translate the wedge-shaped optically active members 93, 95 and a second pitch to translate the further wedge-shaped non-optically active members 105-112. With the two different pitches, at the same amount of rotation of the thread, the two associated wedge-shaped optically active members 93, 95 and further wedge-shaped non-optically active members 105-112 may be moved over different amounts of distance in order to correct for a difference in refractive index or shape between the wedge-shaped optical active member and wedge-shaped non-optically active member. In this embodiment, a relation between a desired movement of the wedge-shaped non-optically active member in order to correct for a beam displacement caused by the movement of the associated wedge-shaped optically active member may be calculated using simple geometrical optics. FIG. 15 schematically depicts the embodiment of FIGS. 13 and 14 wherein the polarization direction of one segment of the radiation beam is adjusted by translating one wedge-shaped optically active member 93 and its associated further wedge-shaped non-optically active member 105 over an equal amount of distance.

The polarization changing element may be located in the illumination system of the lithographic apparatus or between the beam delivery system and the illumination system. Alternatively, the polarization changing element may be located in the projection system. The polarization changing element may be located at or near a field plane in the illuminator. Alternatively, the polarization changing element may be located between a pupil defining element and a pupil plane of the illumination system. Alternatively, the polarization changing element may be located at or near a pupil plane of the illumination system or the projection system. Arranging the polarization changing element at or near a pupil plane is especially advantageous for the embodiments of FIGS. 9 to 15. By arranging the polarization changing element at or near a pupil plane, one or more poles of an illumination mode may coincide with one or more segments of the radiation beam, allowing an accurate adjustment of the polarization direction of an individual pole of an illumination mode.

The wedge-shaped optically active members may include crystalline quartz. Alternatively, the wedge-shaped optically active members may include any optical active material characterized by a high transmission for UV radiation or deep UV radiation.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   a support constructed to support a patterning device, the patterning device configured to provide a radiation beam with a pattern in its cross-section to form a patterned radiation beam;
   a substrate table constructed to hold a substrate;
   a projection system configured to project the patterned radiation beam onto a target portion of the substrate; and
   a polarization changing element comprising at least two wedge-shaped optically active members configured to rotate a polarization direction of at least a portion of the radiation beam by a predetermined angle and an optical propagation length adaptor associated with the wedge-shaped optically active members to adjust the predetermined angle by moving at least one of the wedge-shaped optically active members with respect to another of the wedge-shaped optically active members, wherein the optical propagation length adaptor comprises at least two wedge-shaped non-optically active members configured to correct for a beam displacement, wherein the at least two wedge-shaped non-optically active members are arranged after the at least two wedge-shaped optically active members with respect to the propagation direction of the radiation beam.

2. A lithographic apparatus according to claim 1, wherein the optical propagation length adaptor is configured to move the wedge-shaped optically active member in a direction substantially transverse to an optical axis along which the radiation beam propagates.

3. A lithographic apparatus comprising:
an illumination system configured to condition a radiation beam;
a support constructed to support a patterning device, the patterning device configured to provide the radiation beam with a pattern in its cross-section to form a patterned radiation beam;
a substrate table constructed to hold a substrate;
a projection system configured to project the patterned radiation beam onto a target portion of the substrate; and
a polarization changing element comprising at least two wedge-shaped optically active members configured to rotate a polarization direction of at least a portion of the radiation beam by a predetermined angle and an optical propagation length adaptor associated with the wedge-shaped optically active members to adjust the predetermined angle by moving at least one of the wedge-shaped optically active members with respect to another of the wedge-shaped optically active members,
wherein the optical propagation length adaptor comprises a first wedge-shaped non-optically active member and a second wedge-shaped non-optically active member, wherein the second wedge-shaped non-optically active member is arranged after the first wedge-shaped non-optically active member with respect to the propagation direction of the radiation beam and wherein at least one of the first wedge-shaped non-optically active member or second wedge-shaped non-optically active member is configured to move in conjunction with the movable at least one of the wedge-shaped optically active members.

4. A lithographic apparatus according to claim 3, wherein an exit surface of a wedge-shaped optically active member of the at least two wedge-shaped optically active members is in optical contact with an entry surface of the first wedge-shaped non-optically active member or the second wedge-shaped non-optically active member.

5. A lithographic apparatus according to claim 3, wherein the optical propagation length adaptor is configured to move the movable at least one of the wedge-shaped optically active members and the at least one of the first wedge-shaped non-optically active member or second wedge-shaped non-optically active member in a direction substantially transverse to an optical axis along which the radiation beam propagates.

6. A lithographic apparatus according to claim 3, wherein the optical propagation length adaptor is configured to move the movable at least one of the wedge-shaped optically active members in a first direction substantially parallel to an optical axis along which the radiation beam propagates and to move the at least one of the first wedge-shaped non-optically active member or second wedge-shaped non-optically active member in a second direction, wherein the second direction is opposite to the first direction.

7. A lithographic apparatus according to claim 3, wherein the at least one of the first wedge-shaped non-optically active member or second wedge-shaped non-optically active member comprises a retarder material.

8. A lithographic apparatus according to claim 3, wherein the at least two wedge-shaped optically active members and first and second wedge-shaped non-optically active members comprise a pie-shaped cross-section in a plane substantially transverse to an optical axis along which the radiation beam propagates.

9. A lithographic apparatus according to claim 8, wherein an angle of the pie-shaped cross-section enclosed by the sides of the pie-shaped cross-section transecting the optical axis comprises an angle of about 45 degrees.

10. A lithographic apparatus according to claim 1, wherein the polarization changing element is located at or near a pupil plane of an illumination system configured to condition the radiation beam.

11. A lithographic apparatus according to claim 1, wherein the wedge-shaped optically active members comprise crystalline quartz.

12. A lithographic apparatus according to claim 1, wherein the polarization changing element is located in an illumination system configured to condition the radiation beam.

13. A lithographic apparatus according to claim 1, wherein the polarization changing element is located between an illumination system configured to condition the radiation beam and a source configured to output the radiation beam.

14. A device manufacturing method comprising:
generating a radiation beam with a polarization direction in a first direction;
rotating the polarization direction of at least a portion of the radiation beam with a predetermined angle with respect to the first direction using at least two wedge-shaped optically active members;
imparting the radiation beam with a pattern in its cross-section to form a patterned radiation beam;
projecting the patterned radiation beam onto a target portion of a substrate using a projection system;
controlling the predetermined angle by changing an optical propagation length of the radiation beam through the at least two wedge-shaped optically active members by moving at least one of the wedge-shaped optically active members with respect to another of the wedge-shaped optically active members; and
correcting for a transverse displacement of the radiation beam using a first wedge-shaped non-optically active member and a second wedge-shaped non-optically active member, wherein the first and second wedge-shaped non-optically active members are arranged one after another with respect to the propagation direction of the radiation beam.

15. A device manufacturing method according to claim 14, wherein an exit surface of a wedge-shaped optically active member of the at least two wedge-shaped optically active members is in optical contact with an entry surface of the first wedge-shaped non-optically active member or the second wedge-shaped non-optically active member.

16. A device manufacturing method according to claim 14, further comprising moving the first wedge-shaped non-optically active member or the second wedge-shaped non-optically active member in conjunction with the movable at least one of the wedge-shaped optically active members.

17. A device manufacturing method comprising:
generating a radiation beam with a polarization direction in a first direction;
rotating the polarization direction of at least a portion of the radiation beam with a predetermined angle with respect to the first direction using at least two wedge-shaped optically active members;
imparting the radiation beam with a pattern in its cross-section to form a patterned radiation beam;
projecting the patterned radiation beam onto a target portion of a substrate using a projection system,
controlling the predetermined angle by changing an optical propagation length of the radiation beam through the at least two wedge-shaped optically active members by moving at least one of the wedge-shaped optically active members with respect to another of the wedge-shaped optically active members; and
moving a wedge-shaped non-optically active member in a direction substantially parallel to an optical axis along which the radiation beam propagates and opposite to a direction of movement of the movable at least one of the wedge-shaped optically active members.

18. A device manufacturing method according to claim 16, wherein the first wedge-shaped non-optically active member or the second wedge-shaped non-optically active member comprises a retarder material.

19. A device manufacturing method according to claim 16, wherein the at least two wedge-shaped optically active members and the first and second wedge-shaped non-optically active members have a pie-shaped cross-section in a plane substantially transverse to an optical axis along which the radiation beam propagates.

20. A lithographic apparatus comprising:
a support constructed to support a patterning device, the patterning device configured to provide a radiation beam with a pattern in its cross-section to form a patterned radiation beam;
a substrate table constructed to hold a substrate;
a projection system configured to project the patterned radiation beam onto a target portion of the substrate; and
a polarization changing element comprising at least two wedge-shaped optically active members configured to rotate a polarization direction of at least a portion of the radiation beam by a predetermined angle and an optical propagation length adaptor associated with the wedge-shaped optically active members to adjust the predetermined angle by moving at least one of the wedge-shaped optically active members with respect to another of the wedge-shaped optically active members,
wherein the optical propagation length adaptor comprises at least one wedge-shaped non-optically active member with a planar beam exit surface configured to correct for a beam displacement.

21. The lithographic apparatus of claim 20, wherein the optical propagation length adaptor further comprises at least another wedge-shaped non-optically active member with a beam entrance surface substantially parallel to the planar beam exit surface of the at least one wedge-shaped non-optically active member.

* * * * *